US007777529B1

(12) United States Patent
Nguyen et al.

(10) Patent No.: US 7,777,529 B1
(45) Date of Patent: Aug. 17, 2010

(54) LEAKAGE COMPENSATION IN DYNAMIC FLIP-FLOP

(75) Inventors: Toan Thanh Nguyen, San Jose, CA (US); Thungoc M. Tran, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/269,456

(22) Filed: Nov. 7, 2005

(51) Int. Cl.
*G11C 7/00* (2006.01)
(52) U.S. Cl. .............................. 327/57; 327/51; 327/218
(58) Field of Classification Search ................... 327/51, 327/57
See application file for complete search history.

(56) References Cited

U.S. PATENT DOCUMENTS

| | | | | |
|---|---|---|---|---|
| 4,486,673 A * | 12/1984 | Koike | ................... | 327/210 |
| 5,192,878 A * | 3/1993 | Miyamoto et al. | ............ | 327/77 |
| 6,201,418 B1 * | 3/2001 | Allmon | ................... | 327/52 |
| 6,480,036 B2 * | 11/2002 | Bailey et al. | ................... | 327/55 |
| 6,486,719 B2 * | 11/2002 | Kim | ................... | 327/199 |
| 6,972,601 B2 * | 12/2005 | Kim | ................... | 327/52 |
| 7,046,567 B2 * | 5/2006 | Kim | ................... | 365/207 |
| 7,057,421 B2 * | 6/2006 | Shi et al. | ................... | 327/55 |
| 2006/0244502 A1 * | 11/2006 | Kim | ................... | 327/208 |

\* cited by examiner

*Primary Examiner*—Lincoln Donovan
*Assistant Examiner*—Ryan C Jager
(74) *Attorney, Agent, or Firm*—Townsend and Townsend and Crew LLP

(57) ABSTRACT

A dynamic flip-flop includes a leakage compensation circuit enabling operation over a wide range of frequencies. Nodes of the dynamic flip-flop store the flip-flop's state. The leakage compensation circuit drains leakage currents from these nodes to prevent the node voltage from rising and triggering an erroneous state change when a data signal changes in the middle of the clock cycle. The leakage compensation circuit associated with a node is activated when the node is set to a low logic level voltage. The leakage compensation circuit is adapted to draw a current from a node that compensates for the leakage current supplied to the node. At the least, this current draw is sufficient to prevent the voltage at the node from rising above a state change threshold voltage during the time period between refresh operations.

16 Claims, 4 Drawing Sheets

US 7,777,529 B1

LEAKAGE COMPENSATION IN DYNAMIC FLIP-FLOP

BACKGROUND OF THE INVENTION

This invention relates to the field of digital logic circuits and in particular to flip-flop and latch circuits capable of operating at a wide range of speeds. For the purposes of this application, flip-flop circuits and latch circuits should be understood to be interchangeable. Flip-flops are digital logic circuits that are capable of storing one bit of memory. Flip-flops may be used to store data such as the value of a transient signal or the state of a state machine. Typically, flip-flops are synchronized with a clock signal. Flip-flops can be classified as static or dynamic. Static flip-flops often have a feedback loop of logic gates that can preserve its stored data value indefinitely while power is supplied, even if its clock signal is stopped.

Dynamic flip-flops are well-suited for high-speed operation. Dynamic flip-flops use the capacitive properties of portions of its circuit to store the data value. For example, a dynamic flip-flop can include a circuit node that is charged during a portion of a clock cycle with a voltage representing a data value. During the remaining portion of the clock cycle, this circuit node is disconnected from the input and allowed to float, thereby storing the voltage representing a data value. However, the voltage representing a data value will gradually decay, eventually resulting in loss of the data. To avoid this, dynamic flip-flops periodically recharge the voltage of data storage nodes. Typically, this recharging or refresh cycle is performed once per clock cycle and alleviates potential problems due to leakage.

Another leakage-related effect can cause a dynamic flip-flop to erroneously change its state in the middle of a clock cycle. These and other types of leakage effects typically become more pronounced as manufacturing processes are scaled down to smaller dimensions.

Some applications are designed to operate at a predetermined clock frequency or within a relatively narrow range of clock frequencies. Because of this, dynamic flip-flops can be designed so that the leakage effects do not have time between refresh operations to erroneously change their states or outputs. However, programmable devices such as field-programmable gate arrays often must support a wide range of clock frequencies, for example due to the constraints of different designs capable being implemented by programmable devices. For these applications, dynamic flip-flops that are designed to operate correctly at higher clock frequencies can malfunction at lower clock frequencies due to the increased time period between refresh operations, which allows leakage effects sufficient time to override the proper behavior of dynamic flip-flops.

It is therefore desirable for a dynamic flip-flop circuit to be able to operate over a wide range of clock frequencies without undesirable behavior arising from leakage effects.

BRIEF SUMMARY OF THE INVENTION

In an embodiment of the invention, dynamic flip-flop includes a leakage compensation circuit enabling operation over a wide range of frequencies. Nodes of the dynamic flip-flop store the flip-flop's state. The leakage compensation circuit drains leakage currents from these nodes to prevent the voltage of the node from rising and triggering an erroneous change in the state of the flip-flop when a data signal changes in the middle of the clock cycle. In an embodiment, the leakage compensation circuit associated with a node is activated when the node is set to a low logic level voltage. The leakage compensation circuit is adapted to draw a current from a node that compensates for the leakage current supplied to the node. At the least, this current draw is sufficient to prevent the voltage at the node from rising above a state change threshold voltage during the time period between refresh operations.

In an embodiment of the invention, a dynamic flip-flop includes a data input for receiving a data signal, a clock input for receiving a clock signal, and a first circuit node adapted to store a voltage representing a state of the dynamic flip-flop. A pull-up circuit is connected with the first circuit node and adapted to change the voltage of the first circuit node to a high logic level voltage in response to the data signal having a first value during a state transition period specified by the clock signal. A pull-down circuit is connected with the first circuit node and adapted to change the voltage of the first circuit node to a low logic level voltage in response to the data signal having a second value during the state transition period specified by the clock signal. A leakage compensation circuit is connected with the first circuit node and adapted to draw a current from the first circuit node. The current compensates for a leakage current supplied by the pull-up circuit to the first circuit node.

In a further embodiment, the leakage compensation circuit is adapted to be activated when the first circuit node is set to a low logic level voltage. In an additional embodiment, a second circuit node is adapted to store a second voltage representing the state of the dynamic flip-flop. The second voltage may correspond to a voltage representing the logical inverse of the first circuit node voltage. The leakage compensation circuit associated with the first circuit node is adapted to be activated by the second circuit node voltage.

BRIEF DESCRIPTION OF THE DRAWINGS

The invention will be described with reference to the drawings, in which.

DETAILED DESCRIPTION OF THE INVENTION

Figure 1:
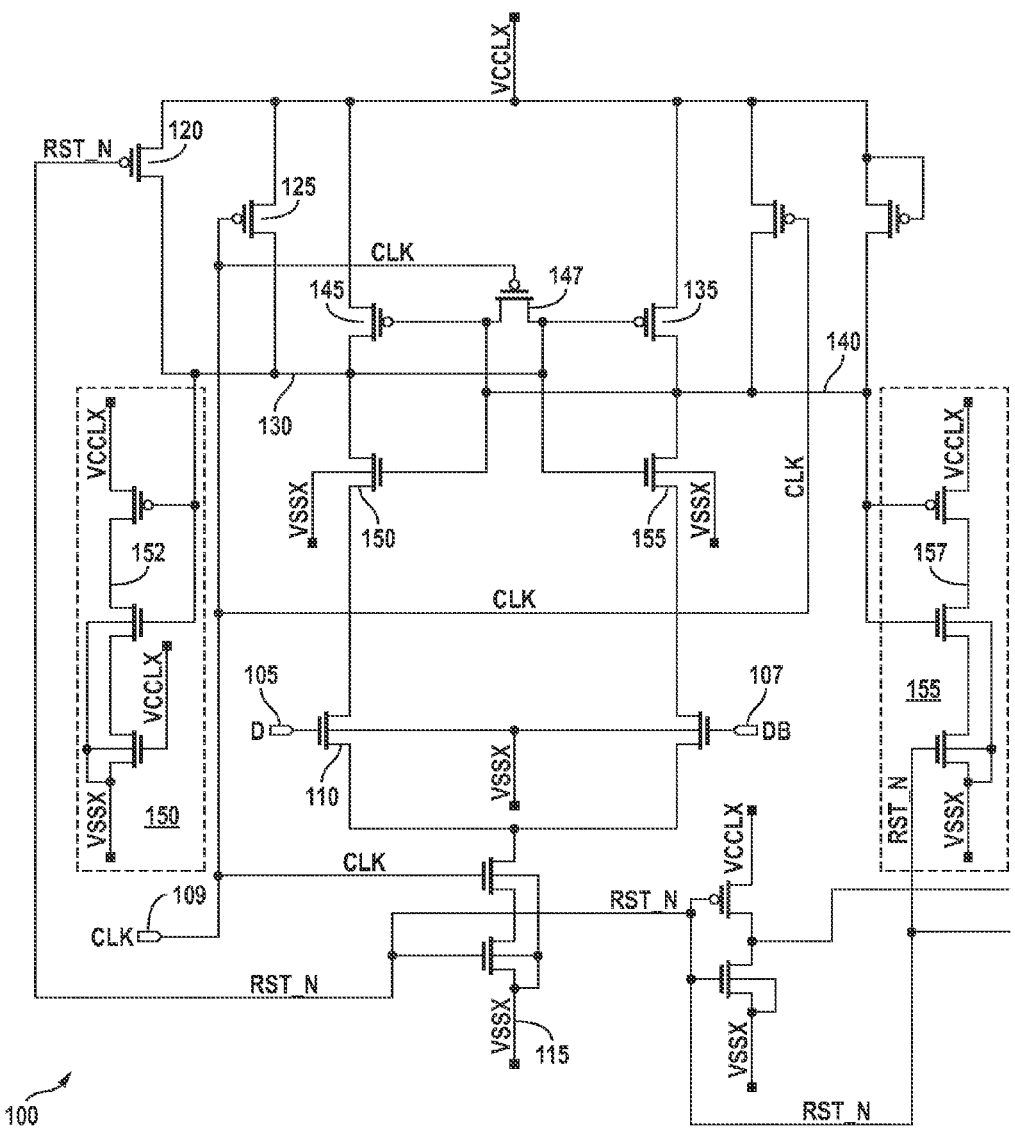
FIG. 1 illustrates a prior dynamic flip-flop circuit and a malfunction caused by leakage.

FIG. 1 illustrates a prior dynamic flip-flop circuit 100 and a malfunction caused by leakage. Dynamic flip-flop circuit 100 includes a data input 105 and inverted data input 107 for receiving an input signal and its inverse, respectively. Dynamic flip-flop circuit 100 also includes a clock signal input 109 for receiving a clock signal. In this implementation, the dynamic flip-flop circuit 100 samples the input signal at the rising or falling edge of the clock signal. The state values of the flip-flop circuit 100, representing the sampled input signal and its inverse, are stored at nodes 140 and 130, respectively, during the clock cycle. The state values of the flip-flop circuit 100 stored at nodes 140 and 130 are mirrored by output circuits 150 and 155, which provide the output signals at nodes 152 and 157 representing the state values of the flip-flop circuit to other portions of the device.

Outside of the hold time associated with the sampling of the input signal, the state values of the flip-flop circuit 100 should remain constant during a clock cycle regardless of the value of the signals at inputs 105 and 107. However, at lower clock frequencies, leakage effects can cause the flip-flop circuit 100 to malfunction and change state values in response to changes in the input signals at inputs 105 and 107 outside the hold time.

For example, if the input signal at input 105 changes from a "1," or high logic level voltage, to a "0," or low logic level, transistor 110 will turn off. This cuts off node 130 from the ground node 115. At the same time, transistors 120 and 125 are supplying leakage current to node 130, even though these transistors are turned off. Because node 130 is now disconnected from ground node 115, the leakage current from transistors 120, 125, 145, and 147 cause the voltage at node 130 to rise.

At higher clock speeds, the refresh operation occurring at every clock cycle happens frequently enough to prevent the voltage at node 130 from rising high enough to trigger a state transition in flip-flop circuit 100. However, at lower clock speeds, the leakage current from transistors 120 and 125 may have enough time to raise the voltage at node 130 above a threshold level. If this occurs, transistor 135 will turn off and transistor 155 will turn on, pulling node 140 to ground. As a result, transistor 145 will turn on and transistor 150 will turn off, connecting node 130 to the high logic level voltage. The voltage at node 130 will thus rise further, changing the state of the flip-flop circuit 100. Similar malfunctions can occur from the inverse of the input signal at input 107 transitioning from "1" to "0."

Figure 2:
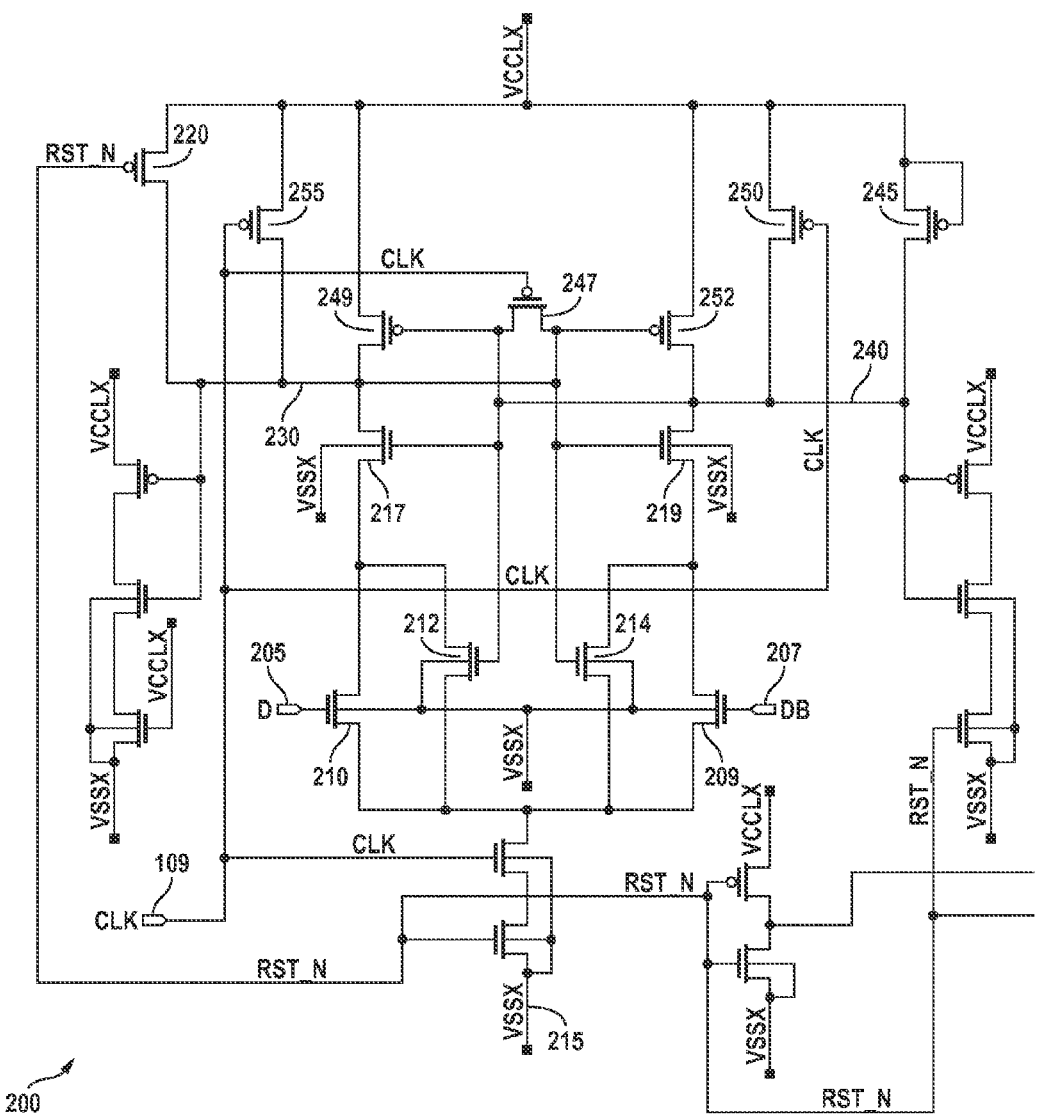
FIG. 2 illustrates a dynamic flip-flop circuit adapted to compensate for leakage according to an embodiment of the invention.

FIG. 2 illustrates a dynamic flip-flop circuit 200 adapted to compensate for leakage according to an embodiment of the invention. Flip-flop circuit 200 includes the addition of weak pull-down transistors 212 and 214. In this embodiment, weak pull-down transistors 212 and 214 are connected between ground node 215 and transistors 217 and 219, respectively. Weak pull-down transistor 212 is controlled by node 240. Similarly, weak pull-down transistor 214 is controlled by node 230.

When node 240 has a value of "1," weak pull-down transistor 212 is turned on. If the input signal at input 205 changes from a "1" to a "0" during the middle of a clock cycle, transistor 210 will turn off. However, node 230 has an alternate connection with the ground node 215 via weak pull-down transistor 212. In this condition, the leakage currents from transistors 220, 225, 247, and 249 will pass through node 230, weak pull-down transistor 212, and to ground node 215. As a result, the voltage at node 230 will not rise due to the leakage current from transistors 220, 225, 247, and 249. Thus, the flip-flip circuit 200 will not erroneously change state due to these leakage currents.

Similarly, when node 230 has a value of "1," weak pull-down transistor 214 is turned on. If the input signal at input 207 changes from a "1" to a "0" during the middle of a clock cycle, transistor 209 will turn off. However, node 240 has an alternate connection with the ground node 215 via weak pull-down transistor 214. In this condition, the leakage currents from transistors 245, 250, 247, and 252 will pass through node 240, weak pull-down transistor 214, and to ground node 215. As a result, the voltage at node 240 will not rise due to the leakage current from transistors 245, 250, 247, and 252 and the flip-flip circuit 200 will not erroneously change state.

In this embodiment, the weak pull-down transistors 212 and 214 are configured to provide sufficient current drain to compensate for the leakage current from transistors 220, 225, 245, 247, 249, 250, and 252. This may be a current drain greater than, equal to, or less than the total leakage current supplied to nodes 230 and 240, respectively. In the case of the latter, the current drain should be sufficiently large as to prevent the voltage at nodes 230 or 240 from rising above the state transition threshold voltage during the longest possible clock period used by the device including the dynamic flip-flop. Additionally, the weak pull-down transistors 212 and 214 should not provide so much current drain that they prevent the voltage on nodes 230 and 240 from rising during state transitions when required. Within these guidelines, the capacitance of weak pull-down transistors 230 and 240 should be kept as small as possible to minimize the delay of the dynamic flip-flop circuit.

Figure 3:
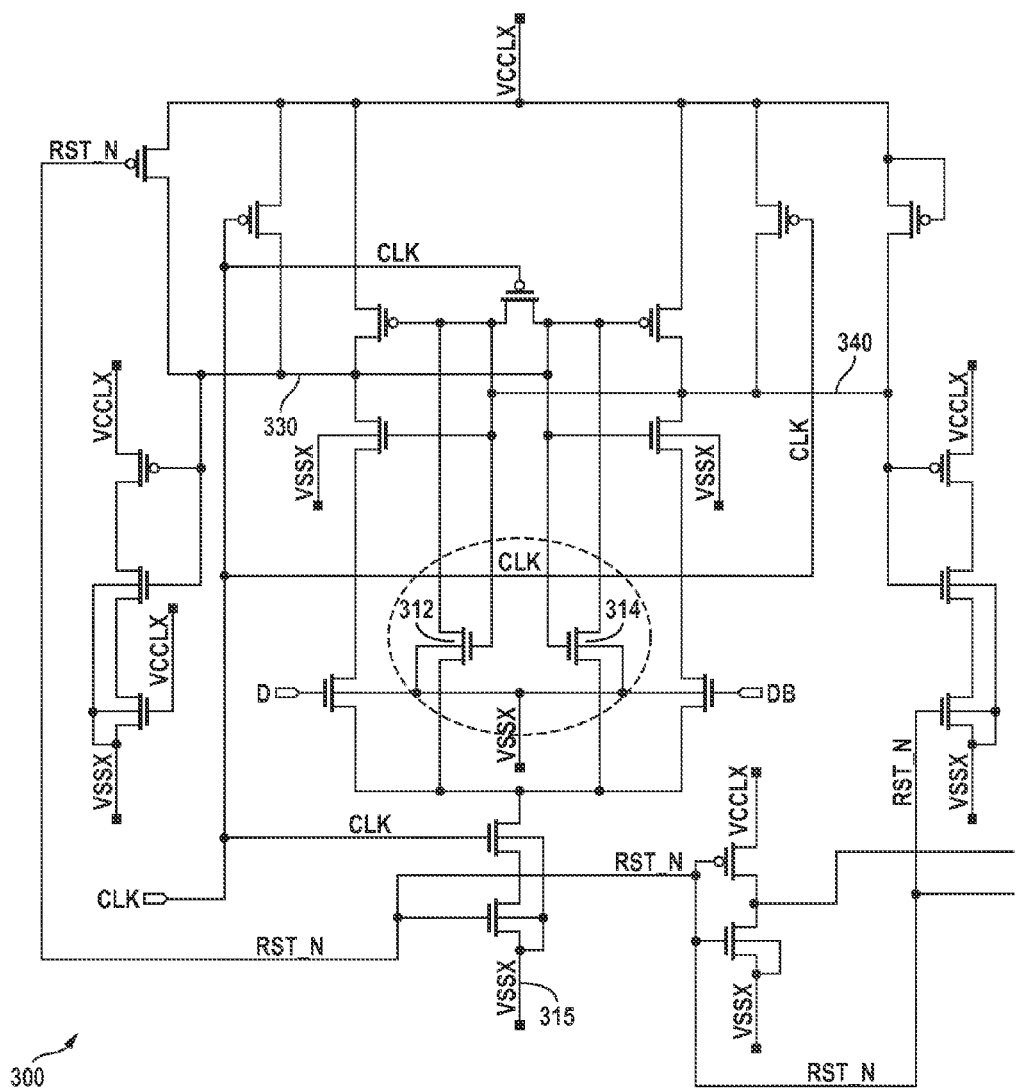
FIG. 3 illustrates a dynamic flip-flop circuit adapted to compensate for leakage according to another embodiment of the invention.

FIG. 3 illustrates a dynamic flip-flop circuit 300 adapted to compensate for leakage according to another embodiment of the invention. Circuit 300 is configured similarly to circuit 200, except that weak pull-down transistors 312 and 314 are connected between ground node 315 and nodes 330 and 340, respectively. In the dynamic flip-flop circuit 300, the weak pull-down transistors 312 and 314 drain leakage current from nodes 330 and 340. In dynamic flip-flop circuit 200, the weak pull-down transistors 212 and 214 impose a smaller electrical load on their respective nodes than the weak pull-down transistors 312 and 314, thereby enabling dynamic flip-flop circuit 200 to operate at higher frequencies.

Figure 4:
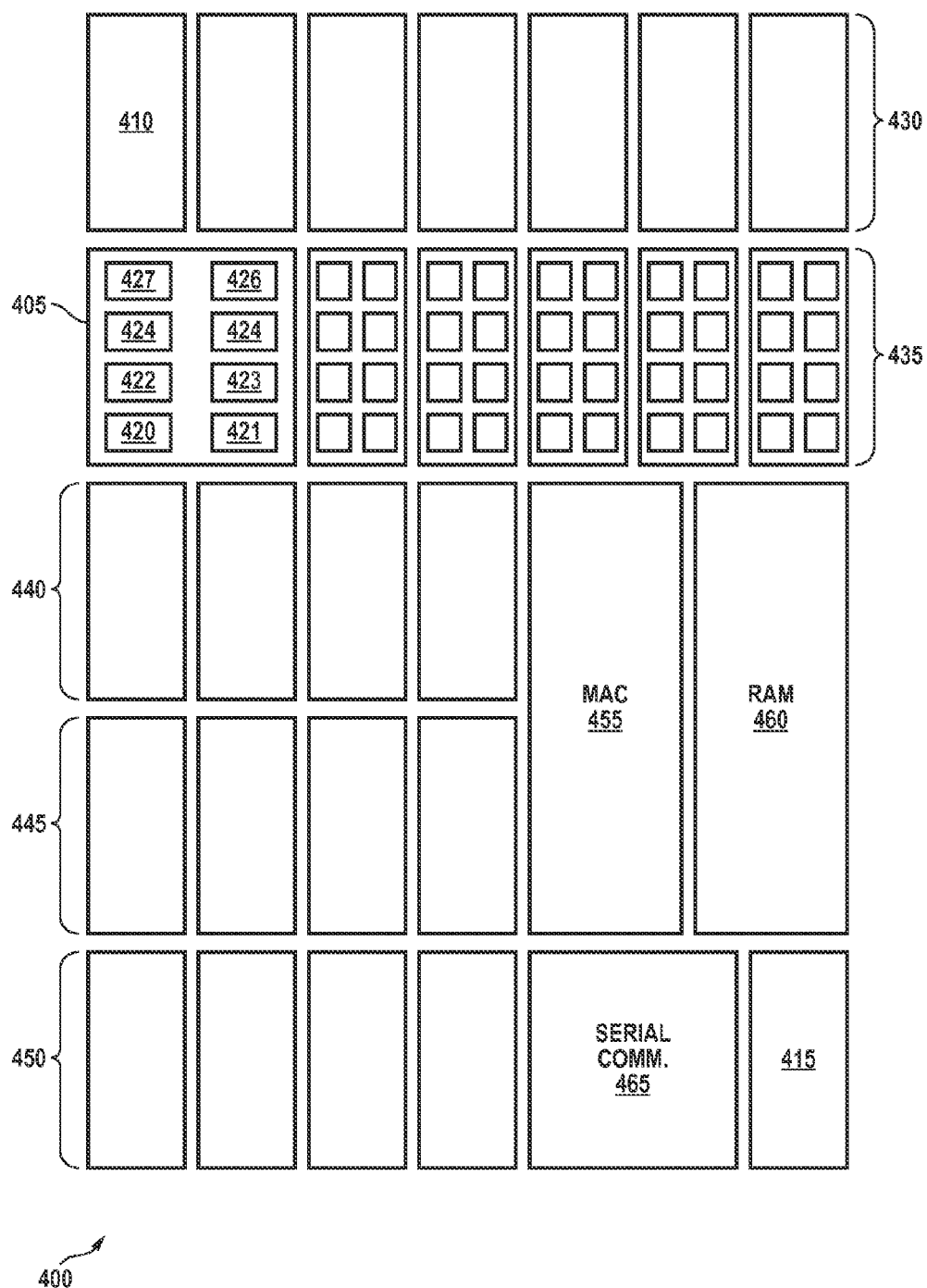
FIG. 4 illustrates a programmable device suitable for use with embodiments of the invention.

FIG. 4 illustrates a programmable device suitable for use with embodiments of the invention. Programmable device 400 includes a number of logic array blocks (LABs), such as LABs 405, 410, 415. Each LAB includes a number of programmable logic cells using logic gates and/or look-up tables to perform logic operations. LAB 405 illustrates in detail logic cells 420, 421, 422, 423, 424, 425, 426, and 427. Logic cells are omitted from other LABs in FIG. 4 for clarity. The LABs of device 400 are arranged into rows 430, 435, 440, 445, and 450. In an embodiment, the arrangement of logic cells within a LAB and of LABs within rows provides a hierarchical system of configurable connections of a programmable switching circuit, in which connections between logic cells within a LAB, between cells in different LABs in the same row, and between cell in LABs in different rows require progressively more resources and operate less efficiently.

In addition to logic cells arranged in LABs, programmable device 400 also include specialized functional blocks, such as multiply and accumulate block (MAC) 455, random access memory block (RAM) 460, and serial communications block 465. The configuration of the programmable device is specified at least in part by configuration data stored in configuration memory 475. The configuration data can include memory access parameters as well as the configuration of the programmable switching circuit. Additional configuration data can be stored in other parts of the programmable device. For example, the configuration data can include look-up table data to be stored in look-up table hardware in a logic cell. The look-up table data specifies a function implemented by the look-up table hardware. For clarity, the portion of the programmable device 400 shown in FIG. 4 only includes a small number of logic cells, LABs, and functional blocks. Typical programmable devices will include thousands or tens of thousands of these elements.

Dynamic flip-flops as described above can be incorporated into portions of the programmable device 400, such as logic cells or functional blocks. This enables the programmable device or portions thereof to operate at a wide range of operating frequencies. For example, serial communications block 465 can include embodiments of the above described dynamic flip-flops to support communications at very high data rates and at much lower data rates where prior dynamic flip-flops would malfunction. In this example, the clock signal of a dynamic flip-flop can be based on the data rate used to send or receive data.

Further embodiments can be envisioned to one of ordinary skill in the art after reading the attached documents. For example, although the invention has been discussed with reference to programmable devices, it is equally applicable to any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A dynamic flip-flop comprising:
   a data input for receiving a data signal;
   a clock input for receiving a clock signal;
   a first circuit node adapted to store a voltage representing a state of the dynamic flip-flop;
   a pull-up circuit connected with the first circuit node and adapted to change the voltage of the first circuit node to a high logic level voltage in response to the data signal having a first value during a state transition period specified by the clock signal;
   a pull-down circuit connected with the first circuit node and adapted to change the voltage of the first circuit node to a low logic level voltage in response to the data signal having a second value during the state transition period specified by the clock signal, said pull-down circuit comprising first and second transistors; and
   a leakage compensation circuit comprising a third transistor connected with a second circuit node and adapted to draw a current from the first circuit node, wherein the current compensates for a leakage current supplied by the pull-up circuit to the first circuit node, and wherein the third transistor is weaker than the first and second transistors.

2. The dynamic flip-flop of claim 1, wherein the leakage compensation circuit is adapted to be activated when the first circuit node is set to the low logic level voltage.

3. The dynamic flip-flop of claim 1, wherein the current drawn by the leakage compensation circuit is sufficient to prevent the first circuit node from exceeding a state change threshold voltage during a period of the clock signal.

4. The dynamic flip-flop of claim 1, wherein the current drawn by the leakage compensation circuit is approximately equal to the leakage current supplied by the pull-up circuit to the first circuit node.

5. The dynamic flip-flop of claim 1, wherein the current drawn by the leakage compensation circuit is less than a pull-up current supplied by the pull-up circuit to change the voltage of the first circuit node during the state transition period specified by the clock signal.

6. The dynamic flip-flop of claim 1 wherein the second circuit node is adapted to store a second voltage representing the state of the dynamic flip-flop, wherein the leakage compensation circuit is adapted to be activated by the second circuit node.

7. The dynamic flip-flop of claim 6, wherein the second voltage corresponds with the logical inverse of the voltage of the first circuit node.

8. The dynamic flip-flop of claim 6, further comprising:
   a second pull-up circuit connected with the second circuit node and adapted to change the second voltage of the second circuit node to the high logic level voltage in response to the data signal having the second value during the state transition period specified by the clock signal;
   a second pull-down circuit connected with the second circuit node and adapted to change the second voltage of the second circuit node to the low logic level voltage in response to the data signal having the first value during the state transition period specified by the clock signal; and
   a second leakage compensation circuit connected with the second circuit node and adapted to draw a second current from the second circuit node, wherein the second current compensates for a second leakage current supplied by the second pull-up circuit to the second circuit node.

9. The dynamic flip-flop of claim 8, wherein the second leakage compensation circuit is adapted to be activated when the second circuit node is set to the low logic level voltage.

10. The dynamic flip-flop of claim 8, wherein the second current drawn by the second leakage compensation circuit is sufficient to prevent the second circuit node from exceeding a state change threshold voltage during a period of the clock signal.

11. The dynamic flip-flop of claim 8, wherein the second current drawn by the second leakage compensation circuit is approximately equal to the second leakage current supplied by the second pull-up circuit to the second circuit node.

12. The dynamic flip-flop of claim 8, wherein the second current drawn by the leakage compensation circuit is less than a pull-up current supplied by the second pull-up circuit to change the voltage of the second circuit node during the state transition period specified by the clock signal.

13. The dynamic flip-flop of claim 1, wherein the leakage compensation circuit is adapted to draw the current directly from the first circuit node.

14. The dynamic flip-flop of claim 1, wherein the leakage compensation circuit is adapted to draw the current from the first circuit node through at least one transistor.

15. The dynamic flip-flop of claim 1 wherein a drain terminal of the third transistor is coupled to a common terminal of the first and second transistors of the pull-down circuit, wherein a gate terminal of the third transistor is coupled to the second node, and wherein a source terminal of the third transistor is coupled to the source terminal of the first transistor of the pull-down circuit.

16. A dynamic flip-flop as recited in claim 1 wherein a drain terminal of the third transistor is coupled to the first node, wherein a gate terminal of the third transistor is coupled to the second node, and wherein a source terminal of the third transistor is coupled to the source terminal of the first transistor of the pull-down circuit.

* * * * *